(12) United States Patent
Bilas et al.

(10) Patent No.: US 10,777,334 B2
(45) Date of Patent: Sep. 15, 2020

(54) WIRING HARNESS ASSEMBLY HAVING MULTIPLE SEPARATED CONDUCTORS EMBEDDED WITHIN A SUBSTRATE

(71) Applicant: Aptiv Technologies Limited, St. Michael (BB)

(72) Inventors: Jared Bilas, North Bloomfield, OH (US); David R. Peterson, Aurora, OH (US); Kurt P. Seifert, Cortland, OH (US); Christopher G. Reider, Canfield, OH (US); Doyeon Y. Sohn, Birmingham, MI (US); Gerald A. Rhinehart, Jr., Lordstown, OH (US); Therese G. Stevens, Warren, OH (US); George A. Drew, Warren, OH (US); John T. Kightlinger, Canfield, OH (US)

(73) Assignee: Aptiv Technologies Limited, St. Michael (BB)

(*) Notice: Subject to any disclaimer, the term of this patent is extended or adjusted under 35 U.S.C. 154(b) by 0 days.

(21) Appl. No.: 16/203,691

(22) Filed: Nov. 29, 2018

(65) Prior Publication Data

US 2019/0172607 A1 Jun. 6, 2019

Related U.S. Application Data

(60) Provisional application No. 62/671,607, filed on May 15, 2018, provisional application No. 62/594,831, filed on Dec. 5, 2017.

(51) Int. Cl.
*H01B 7/00* (2006.01)
*H01B 7/02* (2006.01)
(Continued)

(52) U.S. Cl.
CPC ........... *H01B 7/0045* (2013.01); *B29C 64/10* (2017.08); *B29C 64/106* (2017.08); *B33Y 10/00* (2014.12);
(Continued)

(58) Field of Classification Search
CPC .. H01B 13/24; H01B 13/5202; H01B 7/0045; B60R 16/0207; H01R 13/5202; H01R 12/592; H01R 27/02
See application file for complete search history.

(56) References Cited

U.S. PATENT DOCUMENTS 3,149,896 A * 9/1964 Hall ....................... H01R 12/79
439/329
3,713,073 A * 1/1973 Narozny .............. H01R 12/778
439/456
(Continued)

FOREIGN PATENT DOCUMENTS

EP 3124216 A2 2/2017
JP 2001110485 A 4/2001
(Continued)

OTHER PUBLICATIONS

Partial European Search Report for European Patent Application No. 18209846.5, dated May 9, 2019 by the European Patent Office.
(Continued)

*Primary Examiner* — Briggitte R. Hammond
(74) *Attorney, Agent, or Firm* — Billion & Armitage; Robert Myers

(57) ABSTRACT

A wiring harness assembly includes a plurality of separated conductors formed of an electrically conductive material, a substrate formed of a dielectric material encasing the plurality of separated conductors, a location feature integrally formed with the substrate and an opening defined in the substrate having a predetermined size and shape. A section
(Continued)

of the plurality of separated conductors is exposed within the opening. The opening is precisely located relative to the location feature.

20 Claims, 8 Drawing Sheets

(51) Int. Cl.
| | |
|---|---|
| H01B 13/00 | (2006.01) |
| H01B 13/012 | (2006.01) |
| H01B 7/36 | (2006.01) |
| H01B 7/40 | (2006.01) |
| H01R 27/02 | (2006.01) |
| H01R 13/502 | (2006.01) |
| H01R 12/67 | (2011.01) |
| B60R 16/02 | (2006.01) |
| B33Y 80/00 | (2015.01) |
| H01R 12/59 | (2011.01) |
| B29C 64/10 | (2017.01) |
| B33Y 10/00 | (2015.01) |
| H05K 3/00 | (2006.01) |
| B33Y 30/00 | (2015.01) |
| H01B 13/24 | (2006.01) |
| B29C 64/106 | (2017.01) |
| H01R 13/52 | (2006.01) |

(52) U.S. Cl.
CPC .............. *B33Y 30/00* (2014.12); *B33Y 80/00* (2014.12); *B60R 16/0207* (2013.01); *H01B 7/009* (2013.01); *H01B 7/0275* (2013.01); *H01B 7/363* (2013.01); *H01B 7/40* (2013.01); *H01B 13/0013* (2013.01); *H01B 13/01209* (2013.01); *H01B 13/01236* (2013.01); *H01B 13/01263* (2013.01); *H01B 13/24* (2013.01); *H01R 12/592* (2013.01); *H01R 12/675* (2013.01); *H01R 13/502* (2013.01); *H01R 27/02* (2013.01); *H05K 3/00* (2013.01); *H01B 13/01254* (2013.01); *H01R 13/5202* (2013.01); *H01R 13/5205* (2013.01); *H01R 2201/26* (2013.01)

(56) References Cited

U.S. PATENT DOCUMENTS

| | | | | |
|---|---|---|---|---|
| 3,999,826 A * | 12/1976 | Yurtin | ............... | H01R 12/592 439/495 |
| 4,278,314 A * | 7/1981 | Moser | ............... | H01R 12/675 439/404 |
| 5,252,091 A | 10/1993 | Fujita et al. | | |
| 5,309,634 A | 5/1994 | Van Order et al. | | |
| 5,356,308 A * | 10/1994 | Toba | ............... | H01R 13/5219 439/422 |
| 5,993,247 A * | 11/1999 | Kidd | ............... | H01R 12/78 439/329 |
| 6,038,764 A * | 3/2000 | Yamaguchi | ............ | H01R 43/28 174/72 A |
| 6,177,635 B1 * | 1/2001 | Sugiura | ............... | B60R 16/0215 174/138 G |
| 6,364,695 B1 * | 4/2002 | Watanabe | ............. | H01R 12/78 439/410 |
| 6,462,955 B1 * | 10/2002 | Roberts | ............... | H05K 3/303 174/268 |
| 6,481,101 B2 | 11/2002 | Reichinger | | |
| 6,753,477 B1 * | 6/2004 | Sinkunas | ............. | H01R 12/613 174/117 FF |
| 7,144,270 B2 * | 12/2006 | Wang | ............... | H01R 12/88 439/495 |
| 7,381,064 B2 * | 6/2008 | Bolen | ............... | H01R 12/592 174/117 FF |
| 8,622,753 B2 * | 1/2014 | Balzano | ............... | H01R 13/22 439/225 |
| 9,178,295 B1 * | 11/2015 | Lin | ............... | H05K 1/115 |
| 2003/0068912 A1 | 4/2003 | Johnston et al. | | |
| 2007/0093123 A1 * | 4/2007 | Thomas, Sr. | ........ | H01R 12/592 439/498 |
| 2008/0045077 A1 * | 2/2008 | Chou | ............... | H01R 4/027 439/495 |
| 2011/0130030 A1 | 6/2011 | Morita | | |
| 2014/0328964 A1 * | 11/2014 | Mark | ............... | B29C 70/20 425/166 |
| 2015/0328964 A1 | 11/2015 | Gaudet et al. | | |
| 2016/0311612 A1 | 10/2016 | Ozinga | | |
| 2019/0165502 A1 * | 5/2019 | Hiroki | ............... | H01R 35/04 |

FOREIGN PATENT DOCUMENTS

| | | |
|---|---|---|
| JP | 2006108387 A | 4/2006 |
| JP | 2007165059 A | 6/2007 |
| WO | 2015009938 A1 | 1/2015 |
| WO | 2017124085 A1 | 7/2017 |

OTHER PUBLICATIONS

European Search Report for Application No. 19174023.2, European Patent Office, dated Sep. 17, 2019.

* cited by examiner

WIRING HARNESS ASSEMBLY HAVING MULTIPLE SEPARATED CONDUCTORS EMBEDDED WITHIN A SUBSTRATE

CROSS-REFERENCE TO RELATED APPLICATION

This application claims the benefit under 35 U.S.C. § 119(e) of U.S. Provisional Patent Application No. 62/671,607 filed on May 15, 2018 and of U.S. Provisional Patent Application No. 62/594,831 filed on Dec. 5, 2017, the entire disclosure of each of which is hereby incorporated by reference.

TECHNICAL FIELD OF THE INVENTION

The present invention relates to a wiring harness assembly that includes multiple separated conductors that are embedded within a substrate.

BRIEF DESCRIPTION OF THE SEVERAL VIEWS OF THE DRAWING

The present invention will now be described, by way of example with reference to the accompanying drawings, in which.

DETAILED DESCRIPTION OF THE INVENTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Presented herein is an assembly that includes a number of conductors that a separated from one another and are encased or embedded within a substrate. The substrate defines a location feature. The substrate also defines an opening that has a predetermined size and shape. A section of the plurality of separated conductors is exposed within the opening. The opening is precisely located relative to the location feature. The assembly, particularly a portion of the substrate that defines the location feature and the opening, may be advantageously formed by an automated additive manufacturing process, e.g. 3D printing, stereolithography, digital light processing, fused deposition modeling, fused filament fabrication, selective laser sintering, selecting heat sintering, multi-jet modeling, multi-jet fusion, electronic beam melting, and/or laminated object manufacturing.

The examples presented herein are directed to assemblies in which the conductors are wire electrical conductors. However, other embodiments of the assembly may be envisioned wherein the conductors are fiber optic, pneumatic, hydraulic conductors, or a hybrid assembly having combination of any of these conductors.

Figure 1:
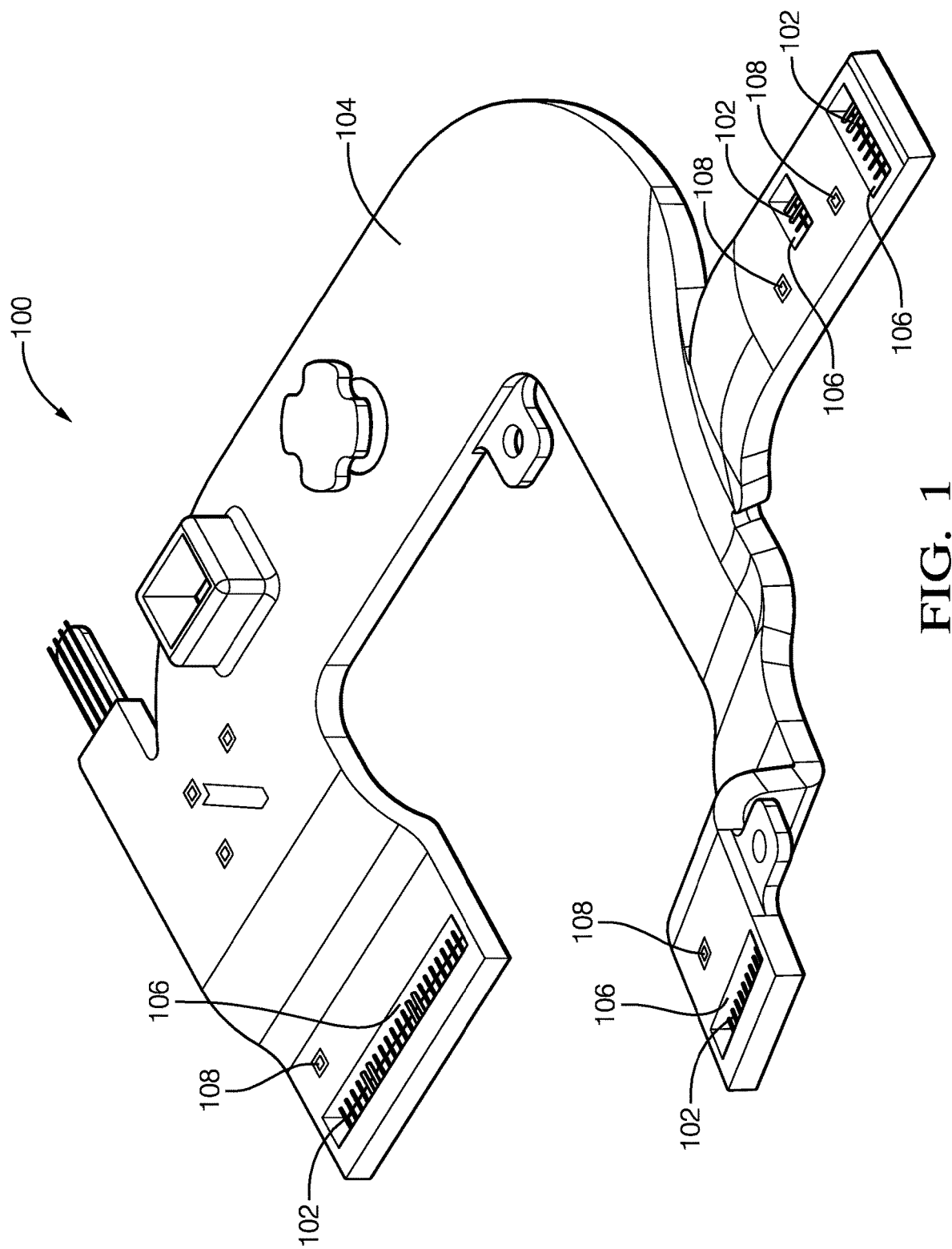
FIG. 1 is a perspective view of an electrical wiring harness, in accordance with one embodiment of the invention.
Figure 2:
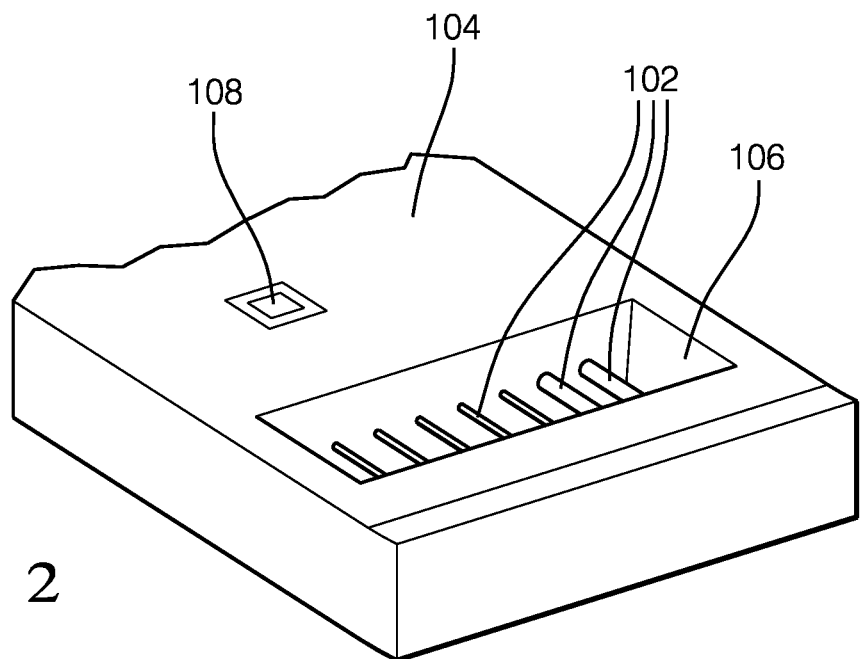
FIG. 2 is a close up view of an aperture in the electrical wiring harness of FIG. 1, in accordance with one embodiment of the invention.

FIG. 1 illustrates an example of an automotive wiring harness assembly according to an embodiment of this invention, hereinafter referred to as the assembly 100. The assembly 100 includes a plurality of wires 102 that are formed of an electrically conductive material, e.g. a metallic alloy, carbon nanostructures, and/or electrically conductive polymers. These wires 102 are separated from one another and are enclosed within, i.e. surrounded by, a substrate 104 that is integrally formed of an electrically insulative material, e.g. a dielectric polymer. As shown in FIG. 2, the substrate 104 also defines an aperture 106 that extends through the substrate 104 and in which a section of the wires 102 are exposed. Referring again to FIG. 1, the substrate 104 defines a location feature 108, e.g. a fiducial mark, an edge, a corner, a notch, a slot, or a hole on/in the substrate 104, that can be used by a human operator or preferably an automated assembly robot (not shown) to determine the location of the aperture 106. The aperture 106 is precisely located relative to the location feature 108. As used herein, "precisely located" means that the position tolerance of the opening relative to the location feature datum is 1 millimeter or less. The position tolerance of the opening may be determined by the capability of the manufacturing technology and/or the capability of the automated assembly robot. This locational relationship between the location feature 108 and the aperture 106 provides the benefit of adding connectors or electronic modules to the assembly 100 using robots rather than requiring human assembly operators. The wires 102 are also precisely located relative to one another and relative to the edges of the aperture 106. As shown in FIG. 1, the substrate 104 surrounds the aperture 106. The exposed section of the wires 102 within the aperture 106 in this example have an electrically conductive surface that is not covered by an insulative jacket. The wires 102 are arranged and maintained by the substrate 104 in a predetermined order. In alternative embodiments, the exposed section of the wires 102 within the aperture 106 may be covered by an insulative jacket. As shown in FIG. 1, the assembly 100 includes several apertures 106 in which several subsets of the wires 102 are exposed. As further shown in FIG. 1, different sections of the same wires may be exposed in more than one aperture. This provides the benefit of allowing multiple connectors to be attached to the same wires. This may provide easy access to power or signal busses that are connected to more than one connector or electronic module.

This assembly 100 lends itself to being manufactured using an automated additive manufacturing process, such as 3D printing, stereolithography, digital light processing, fused deposition modeling, fused filament fabrication, selective laser sintering, selecting heat sintering, multi-jet modeling, multi-jet fusion, electronic beam melting, and/or laminated object manufacturing. The assembly 100 may be produced by the automated additive manufacturing process having a shape that is pre-formed to be placed within the packaging accommodation for the wiring harness within a vehicle. The assembly 100 is also well suited for robotic placement of the assembly 100 within the vehicle.

As illustrated in FIG. 2, the wires 102 may have different diameters depending on the current carrying capabilities required by circuits formed by the wires 102.

Figure 3:
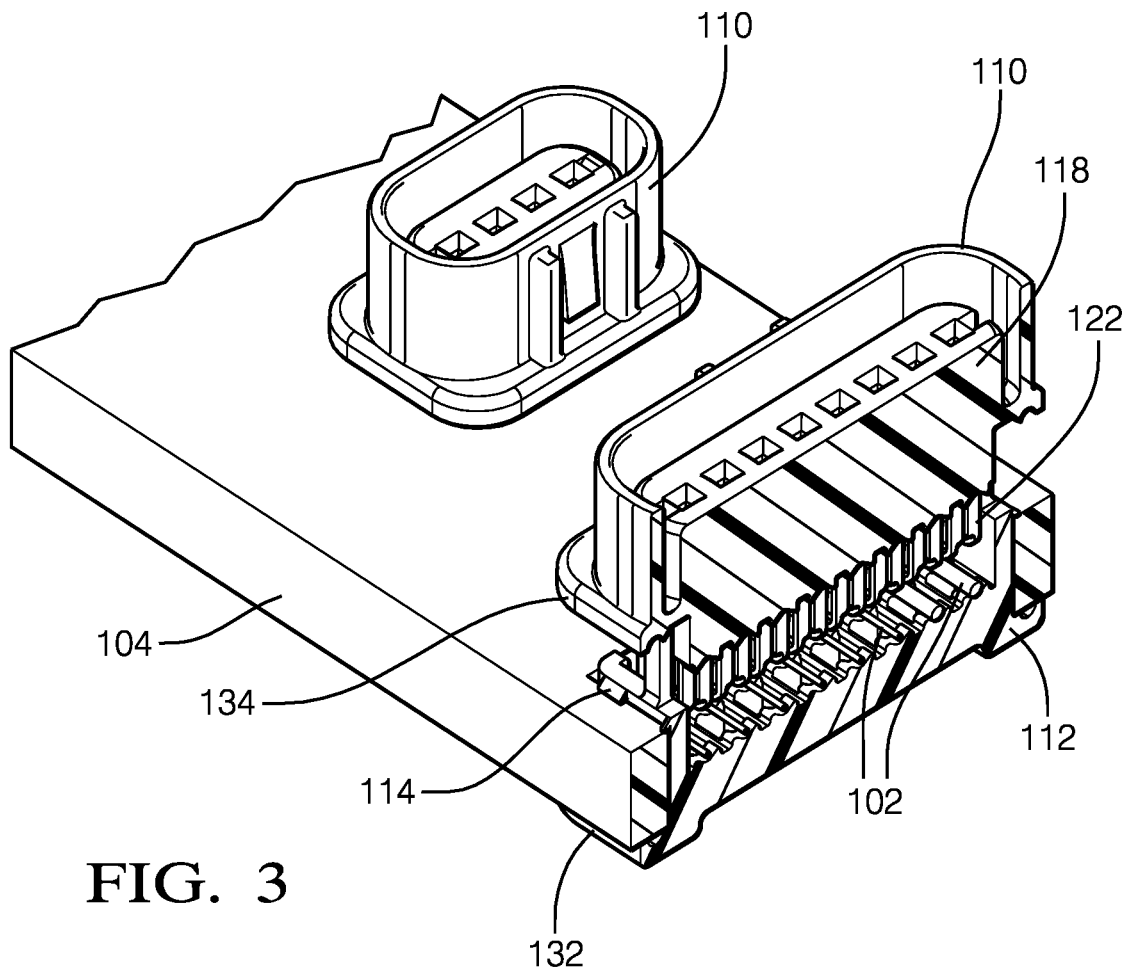
FIG. 3 is a cross section view of an upper and lower support within the aperture of FIG. 2, in accordance with one embodiment of the invention.

As illustrated in FIG. 3, the assembly 100 further includes a connector 110 having a lower support segment 112 disposed within the aperture 106 that is secured to the substrate 104 by a lower locking feature 114. The lower support segment 112 defines cradle features 116, shown in FIGS. 4 and 5, having a plurality of concave arcuate surfaces that contact a lower portion of the each of the wires 102, thereby supporting the wires 102 within the aperture 106. In alternative embodiments, the lower support segment 112 may be integrally formed with the substrate 104.

Returning to FIG. 3, the connector 110 further includes an upper connector segment 118 that is received within the lower support segment 112 and is secured to the lower support segment 112 by an upper locking feature 120. The upper connector segment 118 includes a plurality of terminals 122. The terminals 122 have a first end 124 that is in mechanical and electrical contact with the wires 102 and a second end 126 that is configured to mate with a corresponding mating terminal (not shown) to form an electrical connection with a separate electrical device (not shown), e.g. an electronic control module, a lighting module, an electronic sensor, and/or another electrical wiring harness. In alternative embodiments, the upper connector segment 118 may be integrally formed with the substrate 104 and connected to the substrate 104 by a living hinge. As illustrated in FIG. 3, the assembly 100 includes several connectors. The terminals 122 in one of these connectors may be connected to wires 102 common with the terminals 122 in another connector 110. Alternatively, one of these connectors may not include terminals 122 that are connected to wires 102 common to any of the other connectors.

Figure 5:
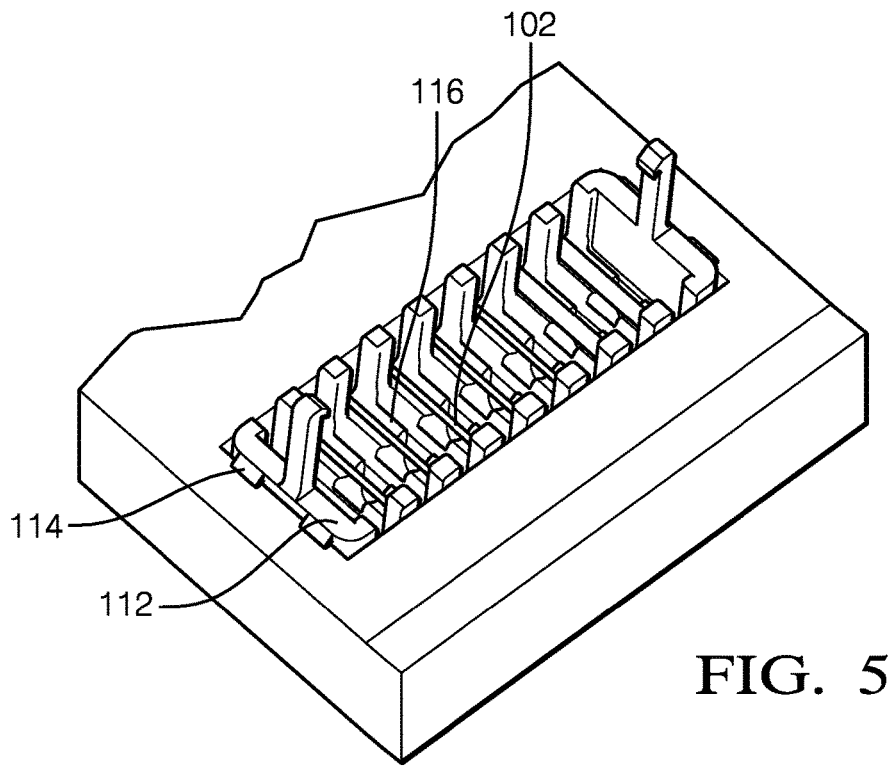
FIG. 5 is a close up view of the lower support of FIG. 3, in accordance with one embodiment of the invention.
Figure 7:
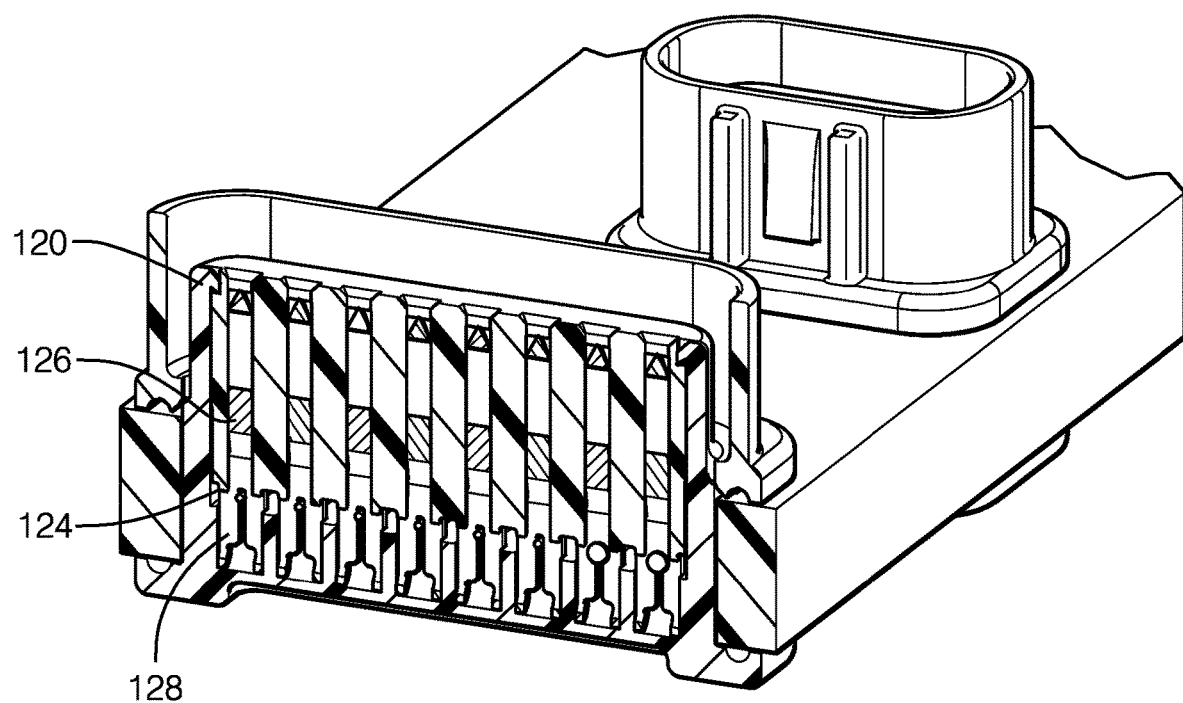
FIG. 7 is a cross section view of terminals in the upper support of FIG. 3 engaging the wires supported by the lower support shown in FIG. 6, in accordance with one embodiment of the invention.
Figure 8:
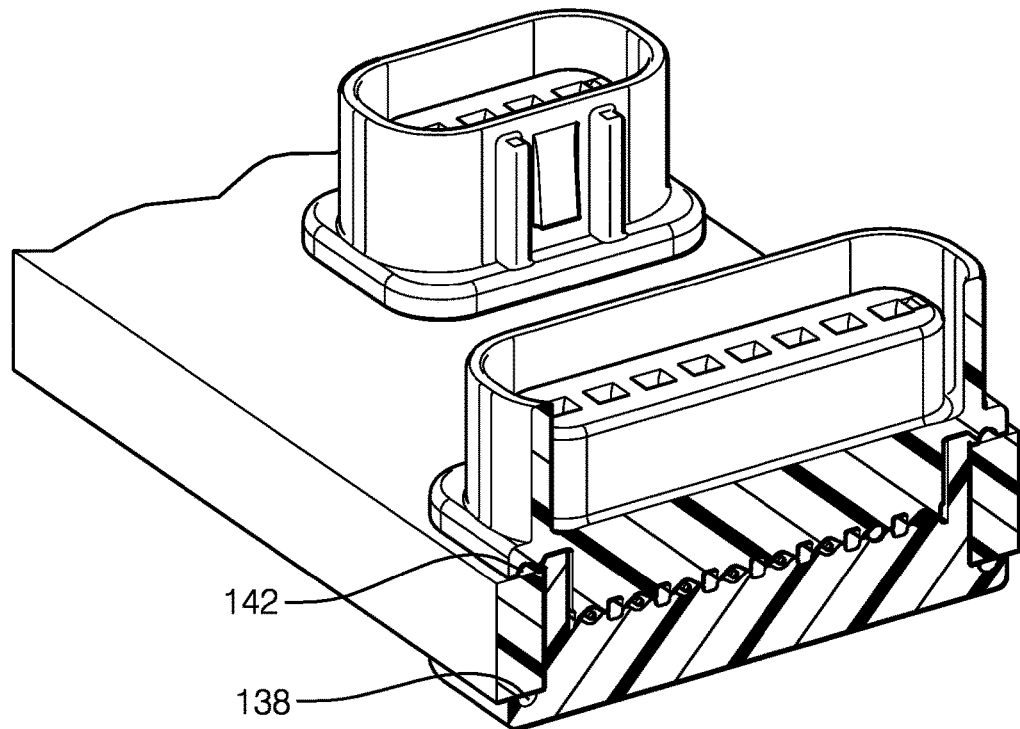
FIG. 8 is a cross section view of seals between the upper support and substrate, the lower support and substrate and the upper support and the lower support, in accordance with one embodiment of the invention.

As illustrated in FIG. 7, the first end 124 of each terminal 122 defines a forked end 128 that has two tines 130. A wire 102 is received between the two tines 130. The walls of the two tines 130 are angled so that the two tines 130 are in compressive contact with the wire 102 when the upper connector segment 118 is fully seated within the lower support segment 112. In alternative embodiments in which the exposed section of the wires 102 within the aperture 106 is covered by an insulative jacket, the two tines 130 are also configured to cut through and displace the insulative jacket so that the terminal 122 can make compressive electrical contact with the wire 102 within. As shown in FIG. 5, the lower support segment 112 defines a plurality of recesses in which the ends of the two tines 130 of the plurality of terminals 122 are received. The cradle features 116 of the lower support segment 112 support the wires 102 to inhibit bending of the wire 102 as the wire 102 is received within the two tines 130 of the terminal 122 and the two tines 130 come into compressive contact with the wires 102.

In an alternative embodiment of the assembly 100, the wires 102 have a coating that is formed of an electrically conductive material (e.g. pure tin or a tin-based solder) that has a lower melting point than the conductive material forming the wires 102. The terminals 122 are metallurgically bonded to the wires 102 by a soldering or welding process due to localized heating of a portion of the coating. This heating may be performed using a laser, resistive heating of the terminal 122 and the wire 102, application of a soldering iron, or other means.

In alternative embodiments of the assembly 100, the upper connector segment 118 may be replaced by an upper modular segment that itself contains a relay, an electronic controller, an electronic sensor, a lighting device, and/or other electronic devices. The upper modular segment includes terminals 122 that have the first end 124 that is in mechanical and electrical contact with the wires 102 but the second end of the terminal is directly connected to circuitry or electrical or electronic devices within the upper modular segment rather than corresponding mating terminals.

Figure 6:
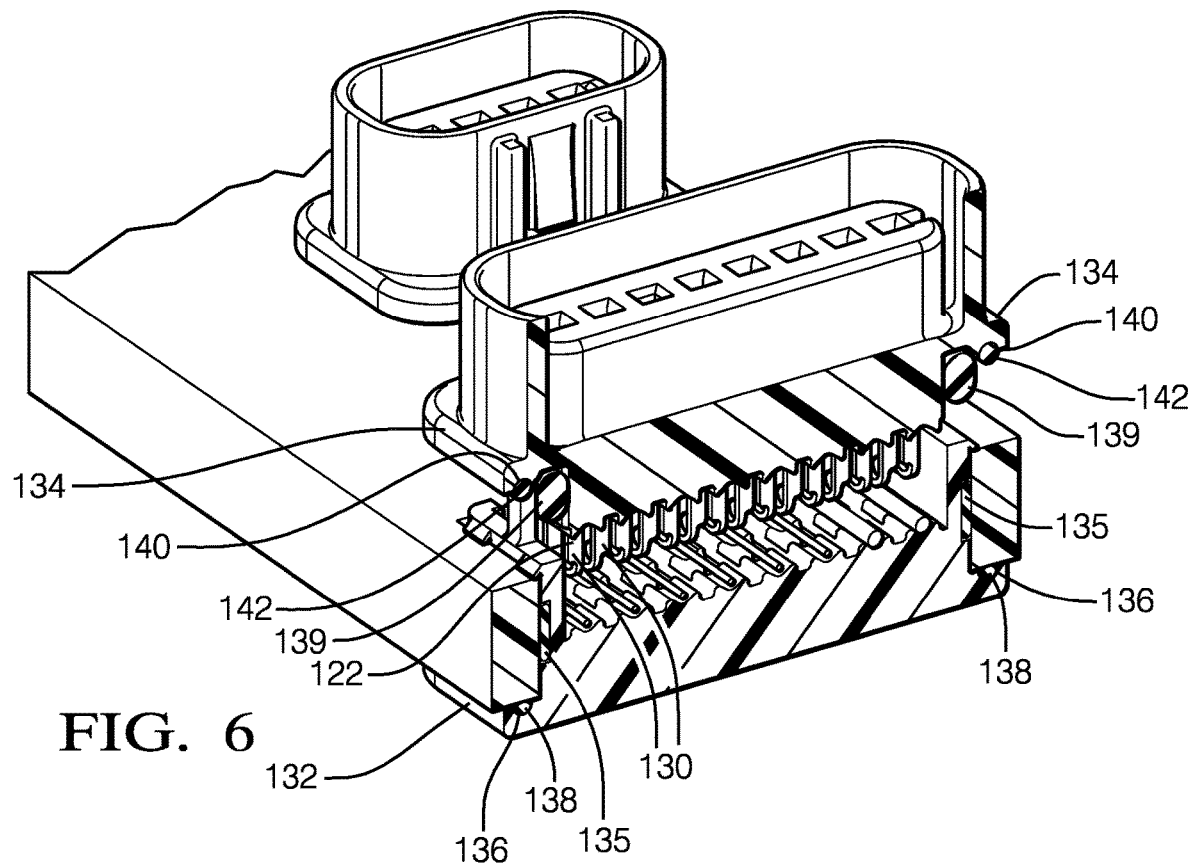
FIG. 6 is a close up cross section view of wires in the lower support of FIG. 3, in accordance with one embodiment of the invention.

As shown in FIGS. 6 and 7, the lower support segment 112 defines a lower lip 132 that extends laterally from the lower support segment 112 and engages a lower surface of the substrate 104 around a perimeter of the aperture 106. The upper connector segment 118 likewise defines an upper lip 134 engaging an upper surface of the substrate 104 around the perimeter of the opening. The lower and upper lips 132, 134 sandwich the substrate 104 therebetween to further secure the lower support segment 112 within the aperture 106. This provides the benefit of limiting longitudinal movement of the connector 110 within the aperture 106.

The lower lip 132 defines a lower groove 136 that contains a lower seal 138 that is formed of a compliant material (e.g. a silicone rubber). The lower seal 138 engages the lower surface of the substrate 104 around the perimeter of the aperture 106 and seals the interface between the lower support segment 112 and the substrate 104 to inhibit intrusion of contaminants, such as dust and fluids, into the aperture 106, thereby protecting the terminals 122 and the wires 102 within the aperture 106. The upper lip 134 similarly defines an upper groove 140 that contains an upper seal 142 that is also formed of a compliant material, such as silicone rubber, that engages the upper surface of the substrate 104 around the perimeter of the aperture 106 and seals the interface between the upper connector segment 118 and the substrate 104 to inhibit intrusion of contaminants into the aperture 106, thereby protecting the terminals 122 and the wires 102 within the aperture 106. A single seal design and construction may be used for the lower seal 138 and the upper seal 142 in order to provide the benefit of reduced number of unique parts in the assembly 100.

In alternative embodiments of the assembly 100, the assembly 100 may further include a first inner seal 135 that is located intermediate the lower support segment 112 and an inner surface of the aperture 106 that engages both the lower support segment 112 and the substrate 104. The assembly 100 may also include a lower seal 138 that is formed of a compliant material and sealingly engages a lower inner surface of the substrate 104 within the aperture 106 to inhibit intrusion of contaminants, such as dust and fluids, into the aperture 106. The first inner seal 135 may be used in addition to, or instead of, the lower seal 138. In this or other alternative embodiments, the assembly 100 may additionally include a second inner seal 139 that is formed of a compliant material located intermediate the upper connector segment 118 and the lower support segment 112 to further inhibit intrusion of contaminants into the aperture 106.

Figure 4:
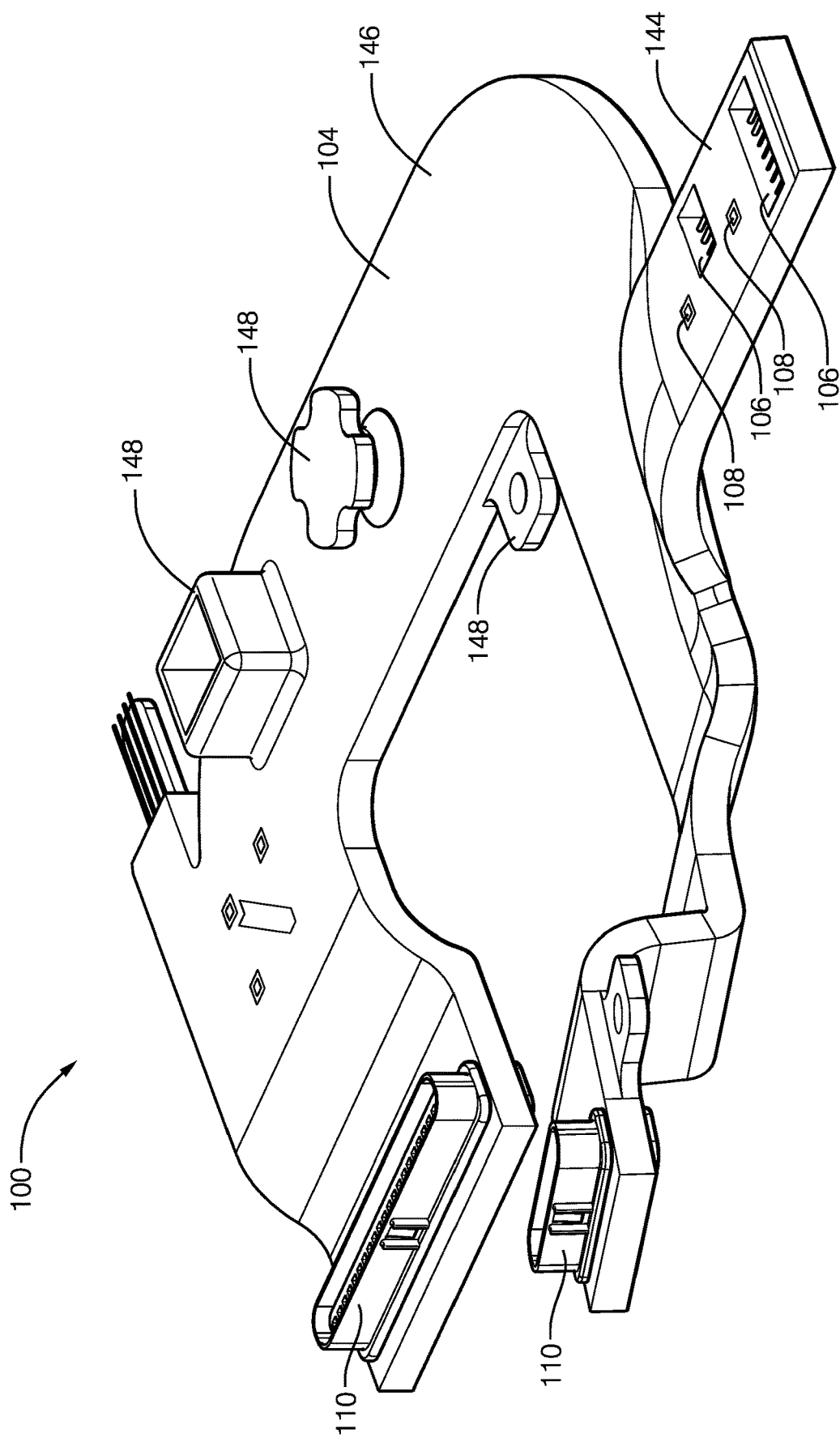
FIG. 4 is a perspective view an electrical wiring harness assembly including the electrical wiring harness of FIG. 1, in accordance with one embodiment of the invention.

As shown in FIG. 4, a first region 144 of the substrate 104 surrounding the opening is thicker than a second region 146 of the substrate 104 remote from the opening. This greater thickness of the substrate 104 in the first region 144 than the second region 146 provides increased stiffness in the first region 144 relative to the second region 146. The increased stiffness in the first region 144 around the aperture 106 provides the benefit of a secure connection between the connector 110 and the substrate 104 while the decreased stiffness in areas remote from the aperture 106 allow the assembly 100 to flex in order to be installed within a vehicle. There may also be other regions of varying stiffness in the harness. These variations may provide benefits of providing mounting features or reducing the probability of the assembly 100 rattling when installed in the vehicle.

In alternative embodiments of the assembly 100, the increased stiffness in the first region 144 relative to the second region 146 may be provided by the substrate 104 being formed in a particular shape, e.g. including a stiffening rib or beam. The stiffness may also vary due to differences in the structure of the material, e.g. a lattice structure vs. a solid structure, differences in thickness of the material, or use of different polymer materials having different stiffness properties e.g. polyamide and polypropylene.

Figure 9:
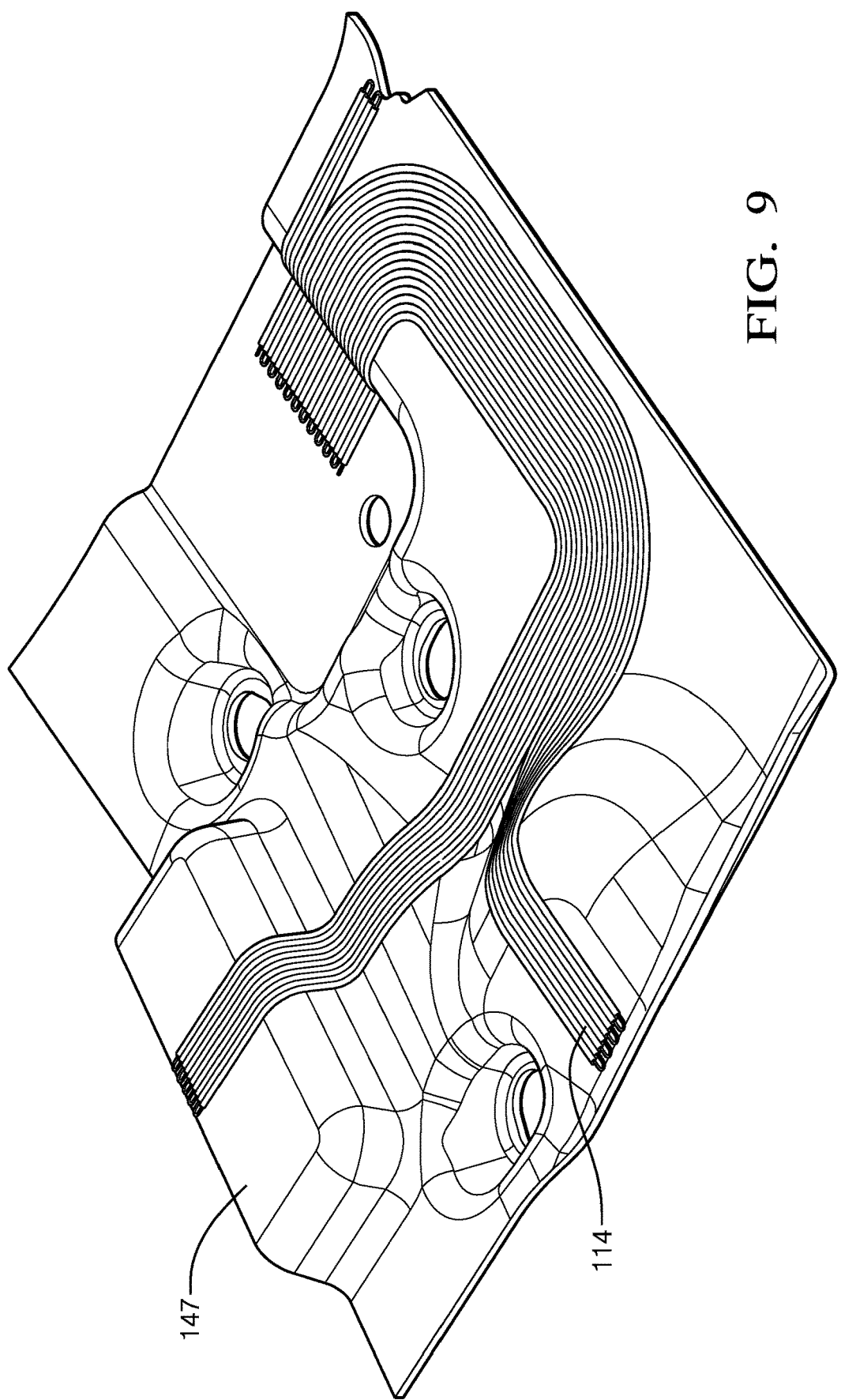
FIG. 9 is a perspective view of the electrical wiring harness disposed on a portion of the vehicle structure, in accordance with one embodiment of the invention.

In alternative embodiments of the assembly 100, the substrate 104 is a structural portion of a motor vehicle 147, such as a headliner, trim panel, body panel, floor liner, or hood liner as shown in FIG. 9.

As shown in FIG. 4, the assembly 100 also includes attachment features 148 that are incorporated into the substrate 104. These attachment features 148 may be used to secure the assembly 100 to the structural portion of a motor vehicle 147. The attachment features 148 may be integrally formed by the substrate 104 or they may be discrete parts that are incorporated into the substrate 104 during the forming of the substrate 104 by forming the substrate 104 around a portion of the attachment feature 148. The attachment features 148 shown in FIG. 4 are eyelets that receive a stud, bolt, push pin or other attachment device having a shaft and a head. In alternative embodiments, the attachment features 148 may be smooth studs, treaded studs, barbed pins, "fir trees" or other attachment features 148 known to those skilled in the art.

Figure 10:
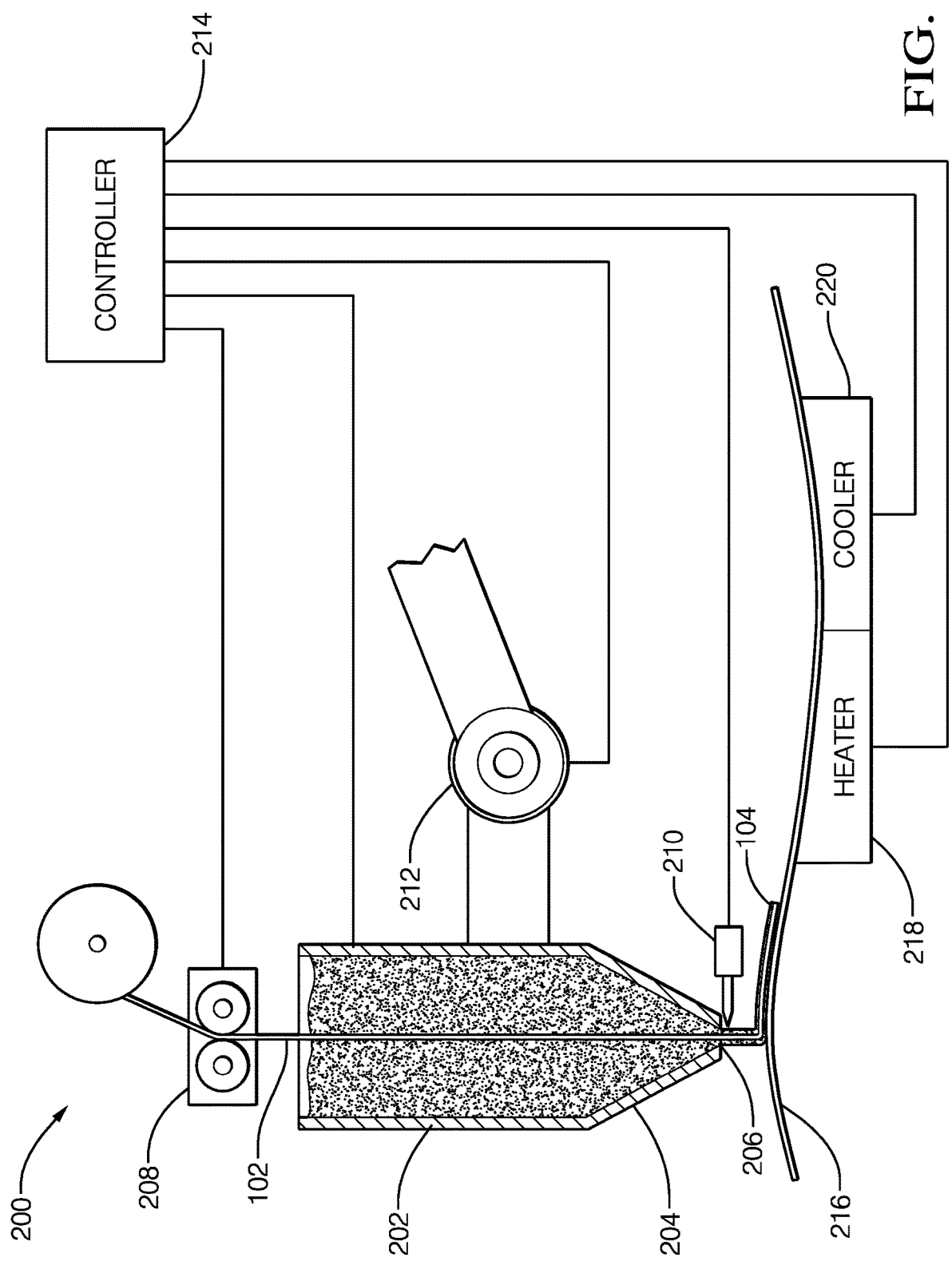
FIG. 10 is a schematic view of an apparatus configured to manufacture the electrical wiring harness of FIG. 1, in accordance with another embodiment of the invention.

Also presented herein is an apparatus that can be used to manufacture the assembly 100 described above. FIG. 10 illustrates an 3D printing apparatus according to an embodiment of the invention, hereinafter referred to as the apparatus 200. The apparatus 200 includes an extruding device 202 with a dispensing head 204 that selectively dispenses a dielectric thermoplastic material though an orifice 206 in the dispensing head 204. The thermoplastic material may be provided to the dispensing head 204 in the form of a thermoplastic filament, as used in filament deposition modeling, thermoplastic pellets, or a thermoplastic powder.

The apparatus 200 also includes a wire feed device 208 that selectively feeds an electrically conductive wire, hereinafter referred to as the wire 102, through the orifice 206. A cutting device 210 that is configured to selectively sever the wire 102 after it passes through the orifice 206 is also included in the apparatus 200. The wire 102 may already be surrounded by an insulative jacket prior to passing through the orifice 206.

This apparatus 200 further comprises an electromechanical device 212, such as a robotic arm, that holds the extruding device 202, the wire feed device 208, and the cutting device 210 and is configured to move the extruding device 202, the wire feed device 208, and the cutting device 210 within a 3D space.

The apparatus 200 additionally encompasses an electronic controller 214 that is in communication with the extruding device 202, the wire feed device 208, the cutting device 210, and the electromechanical device 212. The electronic controller 214 has one or more processors and memory. The processors may be a microprocessors, application specific integrated circuits (ASIC), or built from discrete logic and timing circuits (not shown). Software instructions that program the processors may be stored in a non-volatile (NV) memory device (not shown). The NV memory device may be contained within the microprocessor or ASIC or it may be a separate device. Non-limiting examples of the types of NV memory that may be used include electrically erasable programmable read only memory (EEPROM), masked read only memory (ROM), and flash memory. The memory device contains instructions that causes the electromechanical device 212 to move the extruding device 202, the wire feed device 208, and the cutting device 210 within the 3D space. The instructions also cause the extruding device 202 to selectively dispense the dielectric material though the orifice 206. The instruction further cause the wire feed device 208 to selectively feed the wire 102 through the orifice 206 and cause the cutting device 210 to selectively sever the wire 102.

The memory device may further contains instructions that causes the extruding device 202 to selectively dispense the dielectric material though the orifice 206 as the electromechanically device moves the extruding device 202 in the 3D space to form the substrate 104. The instructions additionally cause the wire feed device 208 to selectively feed the wire 102 through the orifice 206, and the cutting device 210 to selectively sever the wire 102 as the electromechanically device moves the wire feed device 208 and the cutting device 210 in the 3D space to form a plurality of wires 102 formed of the wire 102 that are subsequently encased within the substrate 104 by the extruding device 202. The instructions further cause the electrotechnical device and the extruding device 202 to define a location feature 108 in the substrate 104 and define an aperture 106 in the substrate 104 which has a predetermined size and shape in which a portion of the wires 102 is exposed. This aperture 106 is precisely located relative to the location feature 108.

According to an alternative embodiment of the apparatus 200, the apparatus 200 further includes a 3D curved surface 216 upon which the extruding device 202 selectively dispenses the dielectric material and the wire feed device 208 to selectively deposits the conductive wire. This 3D curved surface 216 provides the benefit of forming the assembly 100 with a predetermined shape.

This alterative embodiment may also include a heating device 218 in communication with the electronic controller 214 and is configured to heat a portion of the 3D curved surface 216. The memory device further contains instructions that causes the cooling device 220 to selectively heat the portion of the curved surface 216. This feature provides the benefit of heating the thermoplastic material while forming the substrate 104 in order to produce a desired shape or material properties.

This alterative embodiment may additionally or alternatively include a cooling device 220 that is also in communication with the electronic controller 214 and is configured to cool a portion of the 3D curved surface 216. The memory device further contains instructions that causes the cooling device 220 to selectively cool the portion of the curved surface 216. This feature provides the benefit of cooling the thermoplastic material while forming the substrate 104 in order to produce a desired shape or material properties. The heating device 218 and the cooling device 220 may be the same device, e.g. a thermoelectric device.

Figure 11:
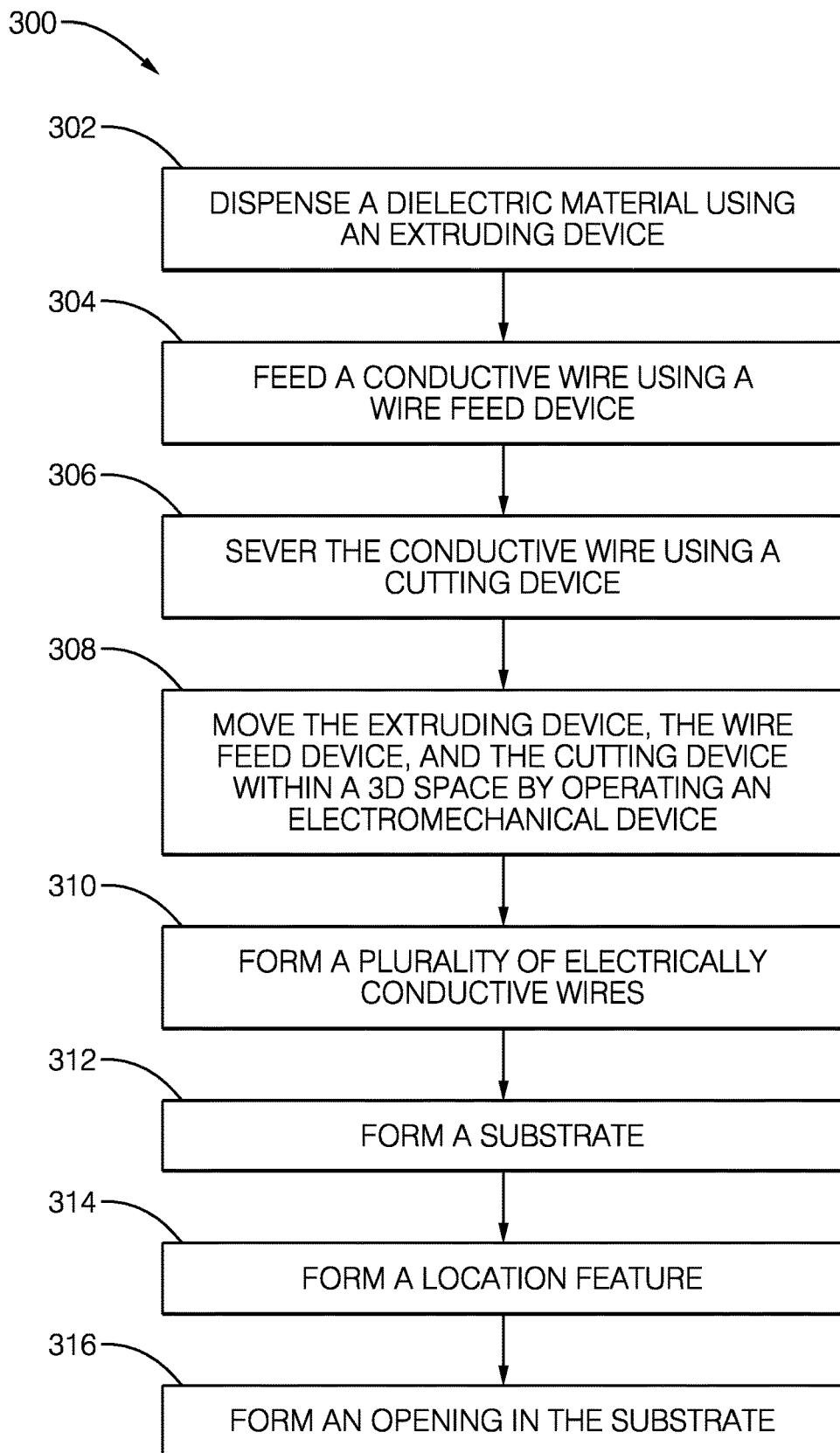
FIG. 11 is a flow chart of a method of operating the apparatus of FIG. 10, in accordance with yet another embodiment of the invention.

Additionally, a method 300 of operating the apparatus 200, as described above, to manufacture the assembly 100, also as described above is presented herein. FIG. 11 illustrates an example of a method 300 of forming a wiring harness assembly 100 using an apparatus 200 comprising an extruding device 202 having a dispensing head 204, a wire feed device 208, a cutting device 210, an electromechanical device 212, and an electronic controller 214 in communication with the extruding device 202, the wire feed device 208, the cutting device 210, and the electromechanical device 212.

The steps of the method 300 of operating the apparatus 200 are described below:

STEP 302, DISPENSE A DIELECTRIC MATERIAL USING AN extruding device 202, includes selectively dispensing a dielectric material though an orifice 206 in the dispensing head 204 by operating the extruding device 202 in accordance with a command from the electronic controller 214;

STEP 304, FEED A CONDUCTIVE WIRE USING A WIRE FEED DEVICE, includes selectively feeding a wire 102 through the orifice 206 by operating the wire feed device 208 in accordance with a command from the electronic controller 214;

STEP 306, SEVER THE CONDUCTIVE WIRE USING A CUTTING DEVICE, includes selectively severing the wire 102 by operating the cutting device 210 in accordance with a command from the electronic controller 214;

STEP 308, MOVE THE EXTRUDING DEVICE, THE WIRE FEED DEVICE, AND THE CUTTING DEVICE WITHIN A 3D SPACE BY OPERATING AN ELECTROMECHANICAL DEVICE, includes moving the extruding device 202, the wire feed device 208, and the cutting device 210 within a 3D space by operating the electromechanical device 212 in accordance with a command from the electronic controller 214;

STEP 310, FORM A PLURALITY OF ELECTRICALLY CONDUCTIVE WIRES, includes forming a plurality of wires 102 by operating the wire feed device 208, the cutting device 210, and the electromechanical device 212 in accordance with a command from the electronic controller 214;

STEP 312, FORM A SUBSTRATE, includes forming a substrate 104 made of the dielectric material that encases the plurality of wires 102 by operating the extruding device 202 and the electromechanical device 212 in accordance with a command from the electronic controller 214;

STEP 314, FORM A LOCATION FEATURE, includes forming a location feature 108 in the substrate 104 by operating the extruding device 202 and the electromechanical device 212 in accordance with a command from the electronic controller 214; and STEP 316, FORM AN OPENING IN THE SUBSTRATE, includes forming an opening or an aperture 106 in the substrate 104 having a predetermined size and shape in which a portion of plurality of wires 102 is exposed by operating the extruding device 202 and the electromechanical device 212 in accordance with a command from the electronic controller 214, wherein the opening or aperture 106 is precisely located relative to the location feature 108.

In an alternative embodiment of the method 300, the apparatus 200 further includes a 3D curved surface 216 and the method 300 further includes a step of selectively dispensing the dielectric material onto the curved surface 216 by operating the extruding device 202 and the electromechanical device 212 in accordance with a command from the electronic controller 214. This embodiment may further include a cooling device 220 in communication with the electronic controller 214 and configured to cool a portion of the curved surface 216 and the method 300 further comprises the step of cooling the portion of the curved surface 216 by operating the cooling device 220 in accordance with a command from the electronic controller 214. This embodiment may alternatively or additionally include a heating device 218 in communication with the electronic controller 214 and configured to heat a portion of the curved surface 216 and the method 300 further comprises the step of heating the portion of the curved surface 216 by operating the heating device 218 in accordance with a command from the electronic controller 214.

Accordingly, a wiring harness assembly 100, an apparatus 200 configured to form the wiring harness assembly 100, and a method 300 of operating the apparatus 200 is provided. The wiring harness provides the benefits of allowing robotic assembly of the wiring harness and robotic installation of the wiring harness into a vehicle or any other subassembly.

While this invention has been described in terms of the preferred embodiments thereof, it is not intended to be so limited, but rather only to the extent set forth in the claims that follow. For example, the above-described embodiments (and/or aspects thereof) may be used in combination with each other. In addition, many modifications may be made to configure a particular situation or material to the teachings of the invention without departing from its scope. Dimensions, types of materials, orientations of the various components, and the number and positions of the various components described herein are intended to define parameters of certain embodiments, and are by no means limiting and are merely prototypical embodiments.

Many other embodiments and modifications within the spirit and scope of the claims will be apparent to those of skill in the art upon reviewing the above description. The scope of the invention should, therefore, be determined with reference to the following claims, along with the full scope of equivalents to which such claims are entitled.

As used herein, 'One or more' includes a function being performed by one element, a function being performed by more than one element, e.g., in a distributed fashion, several functions being performed by one element, several functions being performed by several elements, or any combination of the above.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

While terms of ordinance or orientation may be used herein, these elements should not be limited by these terms. All terms of ordinance or orientation, unless stated otherwise, are used for purposes distinguishing one element from another, and do not denote any particular order, order of operations, direction or orientation unless stated otherwise.

We claim:

1. A wiring harness assembly, comprising:
a plurality of plurality of electrically conductive wires formed of a first electrically conductive material;
a substrate formed of a dielectric material encasing the plurality of separated conductors;
a location feature integrally formed with the substrate;
an opening defined in the substrate having a predetermined size and shape, wherein a section of the plurality of separated conductors is exposed within the opening and wherein the opening is precisely located relative to the location feature; and
a connector having a lower segment disposed within the opening, wherein the connector is secured to the substrate, wherein the lower segment includes a cradle feature that is in mechanical contact with a lower portion of the plurality of electrically conductive wires, thereby supporting the plurality of electrically conductive wires.

2. The wiring harness assembly according to claim 1, wherein the opening is surrounded by the substrate.

3. The wiring harness assembly according to claim 1, wherein the lower segment is integrally formed with the substrate.

4. The wiring harness assembly according to claim 1, wherein the plurality of electrically conductive wires is arranged and maintained is a predetermined order.

5. The wiring harness assembly according to claim 1, wherein a first region of the substrate surrounding the opening has a stiffness that is greater than a second region of the substrate remote from the opening.

6. The wiring harness assembly according to claim 1, wherein the connector further comprises an upper segment secured to the lower segment, wherein the upper segment includes a plurality of terminals, and wherein each terminal in the plurality of terminals is in mechanical and electrical contact with a wire in the plurality of electrically conductive wires.

7. The wiring harness assembly according to claim 6, wherein the upper segment is received within the lower segment.

8. The wiring harness assembly according to claim 6, wherein the connector is mated with a corresponding mating connector having a plurality of corresponding mating terminals mated with the plurality of terminals.

9. The wiring harness assembly according to claim 6, wherein the lower segment comprises a lower seal formed of a first compliant material and sealing engaging a lower inner surface of the substrate within the opening and wherein the upper segment comprises an upper seal formed of a second compliant material and sealing engaging an upper inner surface within the opening.

10. The wiring harness assembly according to claim 6, further comprising an inner seal formed of a third compliant material intermediate the upper segment and the lower segment.

11. The wiring harness assembly according to claim 6, wherein each terminal in the plurality of terminals defines a forked end having two tines, wherein a wire of the plurality of electrically conductive wires is received between the two tines, and wherein the wire is compressively engaged by the two tines.

12. The wiring harness assembly according to claim 11, wherein the lower segment defines a plurality or recesses in which the two tines are received.

13. The wiring harness assembly according to claim 11, further comprising a coating on outer surfaces of the plurality of electrically conductive wires formed of a second electrically conductive material, wherein the second electrically conductive material has a lower melting point than the first electrically conductive material.

14. The wiring harness assembly according to claim 13, wherein one terminal in the plurality of terminals is metallurgically bonded to one electrical conductor in the plurality of electrically conductive wires by localized heating of the coating.

15. The wiring harness assembly according to claim 6, wherein the upper segment comprises an electrical device directly connected to the plurality of terminals.

16. The wiring harness assembly according to claim 15, wherein the electrical device is selected from a list consisting of a relay, an electronic controller, an electronic sensor, a lighting device.

17. The wiring harness assembly according to claim 6, wherein the lower segment comprises a lower lip engaging a lower surface of the substrate around a perimeter of the opening and wherein the upper segment comprises an upper lip engaging an upper surface of the substrate around the perimeter of the opening.

18. The wiring harness assembly according to claim 17, wherein the lower lip comprises a lower seal formed of a first compliant material and sealingly engaging the lower surface of the substrate around the perimeter of the opening and wherein the upper lip comprises an upper seal formed of a second compliant and sealingly engaging the upper surface of the substrate around the perimeter of the opening.

19. The wiring harness assembly according to claim 1, wherein the substrate is formed by an additive manufacturing process.

20. The wiring harness assembly according to claim 19, wherein the additive manufacturing process is selected from a list consisting of 3D printing, stereolithography, digital light processing, fused deposition modeling, fused filament fabrication, selective laser sintering, selecting heat sintering, multi-jet modeling, multi-jet fusion, electronic beam melting, and laminated object manufacturing.

* * * * *